(12) United States Patent
Jang et al.

(10) Patent No.: US 9,158,197 B2
(45) Date of Patent: Oct. 13, 2015

(54) ORGANIC-INORGANIC HYBRID MATERIAL, HYBRID FILM DERIVED THEREFROM, AND METHOD FOR PREPARING THE SAME

(75) Inventors: Guang-Way Jang, Hsin-Chu (TW); Ya-Hui Lin, Hsinchu (TW); I-Chia Tsai, Pingtung (TW); Pei Tien, Yangmei Township, Taoyuan County (TW); Yuung-Ching Sheen, Chu Pei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1654 days.

(21) Appl. No.: 12/283,075

(22) Filed: Sep. 9, 2008

(65) Prior Publication Data

US 2009/0104362 A1    Apr. 23, 2009

Related U.S. Application Data

(60) Continuation-in-part of application No. 10/889,306, filed on Jul. 12, 2004, now abandoned, and a continuation-in-part of application No. 11/951,777, filed on Dec. 6, 2007, which is a division of application No. 10/889,306, filed on Jul. 12, 2004, now abandoned.

(51) Int. Cl.
*C04B 35/00* (2006.01)
*G03F 7/004* (2006.01)
(Continued)

(52) U.S. Cl.
CPC .......... *G03F 7/0043* (2013.01); *C03B 19/1065* (2013.01); *C03C 1/008* (2013.01);
(Continued)

(58) Field of Classification Search
CPC ............ C03B 19/1065; C03B 2201/31; C03B 2201/40; C03B 2201/42; C03C 1/008; C03C 17/009; C03C 2203/27; C03C 2203/28; C03C 2218/113; G03F 7/0043; G03F 7/027; G03F 7/0757; C04B 35/624; C04B 2235/3232; C04B 2235/3287; C04B 2235/441; C04B 2235/3244; C04B 2235/3418; C04B 2235/3229; C04B 2235/3293
USPC .............. 516/22, 31, 100; 528/16, 17, 18, 20; 106/287.1, 287.18, 287.19
See application file for complete search history.

(56) References Cited

U.S. PATENT DOCUMENTS 3,817,905 A * 6/1974 Lerner et al. .................. 524/780
4,042,749 A    8/1977 Sandvig
(Continued)

FOREIGN PATENT DOCUMENTS

JP          05306338 A   * 11/1993
JP          2004225050      8/2004
WO     WO 20040403853      5/2004

OTHER PUBLICATIONS

Derwent Abstract on EAST, week 200278, London: Derwent Publications Ltd., AN 1993-408880, Class A26, JP 05-306338 A, (Mitsubishi Kasei Corp), abstract.*
(Continued)

*Primary Examiner* — Daniel S Metzmaier
(74) *Attorney, Agent, or Firm* — McClure, Qualey & Rodack, LLP

(57) ABSTRACT

A method of preparing an organic-inorganic hybrid material is described. A M(OR)x and an organically modified Si-alkoxide having a predetermined functional group are dissolved in a first solvent and a second solvent to form a first solution and a second solution, respectively. The first solution and the second solution are then mixed and heated. As a result, the M(OR)x reacts with the organically modified Si-alkoxide to form a functionalized organic-inorganic hybrid material. Furthermore, the solid content of the functionalized organic-inorganic hybrid material is increased by transferring the same into another solvent. Therefore, a thick hybrid film is fabricated by means of the transferred functionalized organic-inorganic hybrid material.

21 Claims, 12 Drawing Sheets

(51) Int. Cl.
  *C03B 19/10*    (2006.01)
  *C03C 1/00*    (2006.01)
  *C03C 17/00*    (2006.01)
  *C04B 35/624*    (2006.01)
  *G03F 7/027*    (2006.01)
  *G03F 7/00*    (2006.01)
  *G03F 7/075*    (2006.01)

(52) U.S. Cl.
  CPC ............ *C03C 17/009* (2013.01); *C04B 35/624* (2013.01); *G03F 7/027* (2013.01); *C03B 2201/31* (2013.01); *C03B 2201/40* (2013.01); *C03B 2201/42* (2013.01); *C03C 2203/27* (2013.01); *C03C 2203/28* (2013.01); *C03C 2218/113* (2013.01); *C04B 2235/3229* (2013.01); *C04B 2235/3232* (2013.01); *C04B 2235/3244* (2013.01); *C04B 2235/3287* (2013.01); *C04B 2235/3293* (2013.01); *C04B 2235/3418* (2013.01); *C04B 2235/441* (2013.01); *G03F 7/0757* (2013.01)

(56) References Cited

U.S. PATENT DOCUMENTS

| | | | | |
|---|---|---|---|---|
| 4,059,453 A * | 11/1977 | Dittrich et al. | ............... | 106/38.3 |
| 4,534,928 A * | 8/1985 | Martin | ........................... | 264/334 |
| 4,552,941 A * | 11/1985 | Keogh | ............................ | 528/16 |
| 4,753,827 A * | 6/1988 | Yoldas et al. | ................. | 427/387 |
| 5,130,397 A * | 7/1992 | Zeigler | ............................ | 528/9 |
| 5,231,156 A | 7/1993 | Lin | | |
| 5,250,646 A * | 10/1993 | Kalchauer | ....................... | 528/14 |
| 5,328,975 A * | 7/1994 | Hanson et al. | ................... | 528/29 |
| 5,548,050 A * | 8/1996 | Kushibiki et al. | .................. | 528/9 |
| 5,563,228 A * | 10/1996 | Ogawa et al. | ................... | 528/20 |
| 5,580,819 A * | 12/1996 | Li et al. | .......................... | 427/167 |
| 6,228,796 B1 * | 5/2001 | Arakawa et al. | .............. | 502/159 |
| 6,244,074 B1 * | 6/2001 | Noguchi et al. | ................ | 65/17.2 |
| 6,277,304 B1 * | 8/2001 | Wei et al. | ....................... | 252/500 |
| 6,448,331 B1 * | 9/2002 | Ioka et al. | ...................... | 524/859 |
| 6,476,098 B1 * | 11/2002 | Arakawa et al. | .............. | 523/206 |
| 6,777,092 B1 * | 8/2004 | Hayashi et al. | ................. | 428/429 |
| 2005/0244658 A1 * | 11/2005 | Bae et al. | ....................... | 428/447 |
| 2005/0284087 A1 * | 12/2005 | Yang et al. | .................... | 52/741.1 |

OTHER PUBLICATIONS

Machine Translation of Publ. No. JP 05-306338, published Sep. 1993, Japan patent Office, Tokyo, Japan, obtained online @ http://dossier1.ipdl.inpit.go.jp/AIPN/odse_top_dn.ipdl?N0000=7400 (Downloaded Dec. 23, 2011) pp. 1-9.*

Y. Wei, "Polymer-modified Ceramics",Encyclopedia of Materials: Science and Technology (Second Edition), 2001—month unavailable, pp. 7594-7604 (downloaded Dec. 22, 2011 @ http://www.sciencedirect.com/).*

Suzuki et al, "Preparation and Properties of Inorganic-Organic Composite Materials Containing R3SiO1/2, SiO2, and TiO2 Units", Chem. Mater. 1994—Month unavailable, 6, pp. 692-696.*

Jang, et al., Requirement for Restriction/Election, mailed Dec. 11, 2006, filed Jul. 12, 2004, U.S. Appl. No. 10/889,306, filed US PGPUB 2006/0009536, Publ. Jan. 12, 2006.

Jang, et al., Non-Final Office Action, mailed May 2, 2007, filed Jul. 12, 2004, U.S. Appl. No. 10/889,306, file US PGPUB 2006/0009536, Publ. Jan. 12, 2006.

Jang, et al., Final Office Action, mailed Jan. 9, 2008, filed Jul. 12, 2004, U.S. Appl. No. 10/889,306, file US PGPUB 2006/0009536, Publ. Jan. 12, 2006.

Jang, et al., Non-Final Office Action, mailed Jun. 24, 2008, filed Jul. 12, 2004, U.S. Appl. No. 10/889,306, file US PGPUB 2006/0009536, Publ. Jan. 12, 2006.

* cited by examiner tin (IV) tert-butoxide

Aluminum sec-butoxide 150k

ORGANIC-INORGANIC HYBRID MATERIAL, HYBRID FILM DERIVED THEREFROM, AND METHOD FOR PREPARING THE SAME

CROSS-REFERENCE TO RELATED APPLICATIONS

This application is a continuation-in-part of U.S. application Ser. No. 10/889,306, which was filed on Jul. 12, 2004; and abandoned, and U.S. application Ser. No. 11/951,777, which is a divisional of U.S. Ser. No. 10/889,306 and was filed Dec. 6, 2007, hereby incorporated by reference as it fully set forth herein.

BACKGROUND

1. Field of Invention

The present invention relates to an organic-inorganic hybrid material. More particularly, an organic-inorganic hybrid material and a hybrid film derived therefrom and methods preparing the same by hybrid process without adding any chelating agent are disclosed.

2. Description of Related Art

Organic-inorganic hybrid materials possess not only the advantages of organic materials, such as processability and flexibility, but also the advantages of inorganic materials, like high mechanical strength and high thermal properties, and hence are studied internationally and are widely applied in various fields. In general, a hybrid material is prepared by mixing an organic material and an inorganic material, which are associated by molecular forces therebetween, such as, for example, London-van der Waals force or hydrogen bonding, on a nanometer scale. Therefore, the hybrid material is formed without phase separation in the macroscopic view, and further combines the properties of the organic material and the inorganic material.

Due to the poor thermal properties of organic materials, organic-inorganic hybrid materials cannot be prepared in a conventional ceramic-manufacturing process. Instead, a sol-gel process is usually adopted to fabricate organic-inorganic hybrid materials. Sol-gel process including a hydrolysis step and a condensation step performed at a low temperature. Consequently, organic materials can be introduced into inorganic materials without degradation.

The organic-inorganic hybrid materials prepared by the sol-gel process, however, are easily influenced by surrounding conditions, such as, for instance, temperature or humidity. As a result, the organic-inorganic hybrid materials tend to age, which decreases the shelf life thereof. Additionally, the organic-inorganic hybrid materials with a nanometer dimension incline to aggregate with one another. To stabilize the properties and the sizes of the organic-inorganic hybrid materials, chelating agents are required in preparing the same. The chelating agents are, for example, methacrylic acid, acetic acid, and acetyl acetone.

On the other hand, the solid content of the organic-inorganic hybrid materials prepared by the sol-gel process is usually around 20% to 30%, of which the viscosity is not high enough for preparing a thick hybrid film. Unfortunately, raising the solid content by increasing reaction time and reactant concentrations directly results in gelation of the organic-inorganic hybrid materials. Moreover, phase separation occurs if the viscosity of the organic-inorganic hybrid materials is increased by adding another polymer solution with higher viscosity.

SUMMARY

According to an embodiment of this invention, a functionalized organic-inorganic hybrid material and a preparation method thereof are provided. An organic material and an inorganic material are separately mixed with corresponding solvents, followed by mixing the solvents and heating the same for a period of time to form a functionalized organic-inorganic hybrid material. The inorganic material is a metal alkoxide or silicon alkoxide wherein the valence of the metal atom or silicon atom therein is greater than zero, while the organic material is an organically modified Si-alkoxide. The interaction between the organic-inorganic hybrid materials is effectively reduced, which prevents the organic-inorganic hybrid materials from aggregating with one another, by selecting proper solvents at the beginning of preparation. Therefore, the functionalized organic-inorganic hybrid material with a stable nanometer dimension is formed by means of the selected solvents instead of any chelating agents.

According to another embodiment of this invention, a method for preparing a thick hybrid film derived from a functionalized organic-inorganic hybrid material is provided. The solid content of a functionalized organic-inorganic hybrid material is dramatically raised by transferring the hybrid material into a selected solvent. A thick and uniform film is then formed more easily, since the solid content of the organic-inorganic hybrid material has been increased. Hence, the organic-inorganic hybrid material after being transferred can be directly used to fabricate a thick film with no need of other adhesives, like polymer solution with higher viscosity.

BRIEF DESCRIPTION OF THE DRAWINGS

The foregoing aspects, as well as many of the attendant advantages and features of this invention will become more apparent by reference to the following detailed description, when taken in conjunction with the accompanying drawings, wherein.

DETAILED DESCRIPTION

Figure 1:
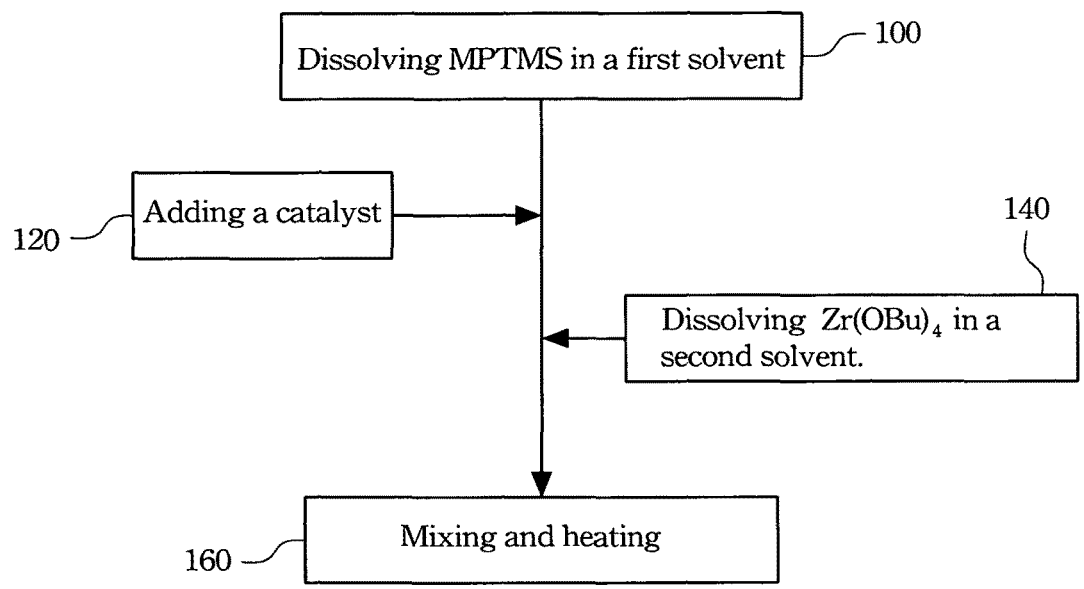
FIG. 1 illustrates a flowchart of preparing a functionalized organic-inorganic hybrid material in accordance with an embodiment of the present invention.

It is found that an organic-inorganic hybrid material with a stable dimension on a nanometer scale is prepared with no need of chelating agents, if the stability of a reactive solution is properly controlled according to the following equations at the beginning of preparation.

$$V_{att} = -\frac{A_{13}}{12} H(x, y) \tag{1}$$

$$A_{13} = -\frac{3}{4}kT\left[\frac{\varepsilon 1 - \varepsilon 3}{\varepsilon 1 + \varepsilon 3}\right]^2 + \frac{3h\nu_e}{16\sqrt{2}} \cdot \frac{(n_1^2 - n_3^2)^2}{(n_1^2 + n_3^2)^{3/2}} \tag{2}$$

Equation (1) represents the attraction energy ($V_{att}$) between two spherical particles (medium 1) dispersed in a medium 3, where $A_{13}$ is the Hamaker constant and $H(x, y)$ is the Hamaker function, which depends on the inter-particle distance and on the particle radius. An approximate expression for $A_{13}$ is given by equation (2), where ∈1 and ∈3 are the dielectric constants of the media, $n_1$ and $n_3$ are their refractive indexes in the visible range, $v_e$ is the absorption frequency of the media assumed to be the same for both of them, k is the Boltzmann constant ($1.38 \times 10^{-23}$ J·K$^{-1}$), T is the absolute temperature, and h is the Planck's constant ($6.626 \times 10^{-34}$ J·s).

According to these equations, the interaction between particles is dependent on the properties of a medium where the particles are dispersed. Consequently, the attraction energy between particles is reduced if an adequate medium is selected; the particles are thus less attracted to one another and aggregate less. Therefore, particles with stable dimensions are obtained without using any chelating agents. By this principle, a functionalized organic-inorganic hybrid material, a method for preparing the same, and a thick hybrid film derived therefrom in accordance with the embodiments of the present invention are disclosed in detail as follows, taken in conjunction with the accompanying drawings.

Embodiment 1

One aspect of the present invention is to provide a metal alkoxide/silicon alkoxide and an organically modified Si-alkoxide having a predetermined functional group as precursors to form a functionalized organic-inorganic hybrid material. Additionally, solvents are selected according to the principle mentioned above before preparing the material. As a result, stable reactive surroundings for the material are provided at the beginning of preparation.

The metal alkoxide or silicon alkoxide can be formulated as $M(OR)_x$, where M is a metal atom or silicon atom, x is the valence of M, and R represents $C_1$-$C_{12}$ alkyl group. Further, the valence of the metal atom (i.e. the difference between the coordination number and the valence of M) is greater than zero. The metal atom is, for example, titanium (Ti), zirconium (Zr), germanium (Ge), tin (Sn), or zinc (Zn). The aforesaid alkoxide includes zirconium butoxide ($Zr(OBu)_4$), zirconium propoxide ($Zr(OPr)_4$), germanium (IV) ethoxide ($Ge(OC_2H_5)_4$), germanium (IV) isopropoxide ($Ge[OCH(CH_3)_2]_4$), titanium ethoxide ($Ti(OC_2H_5)_4$), tertabutyl orthotitanate ($Ti(OC_4H_9)_4$), tin (IV) tert-butoxide ($Sn(OC_4H_9)_4$), tetraethyl orthosilicate ($Si(OC_2H_5)_4$), zinc acetate dihydrate ($Zn(CH_3COO)_2$), or aluminum sec-butoxide ($Al[OC(CH_3)_2]_3$), and zirconium butoxide is preferably used in the embodiment. Furthermore, the organically modified Si-alkoxide can be expressed as $R^1Si(OR)_3$ or $R^1R^2Si(OR)_2$, where R represents $C_1$-$C_{12}$ alkyl, and $R^1$ and $R^2$ are hydrocarbyl groups that may be different or the same. The predetermined functional group ($R^1$ or $R^2$) may be an epoxy group or an amine group (—NH), or an unsaturated functional group, such as a vinyl group, an acryl group, or a photosensitive derivative thereof. Moreover, methacryloxypropyl tri-methoxysilane (MPTMS) is preferably used in the embodiment.

| First solution | | |
|---|---|---|
| First solvent | THF | 30 g |
| organically modified Si-alkoxide | methacryloxypropyl tri-methoxysilane (MPTMS) | 15 g (0.06 mol) |
| catalyst | 0.1 N HCl | ≥0.01 mole |

| -continued | | |
|---|---|---|
| Second solution | | |
| Second solvent | THF | 10 g |
| Metal alkoxide | Zirconium butoxide | 11.51 g (0.03 mol) |
| Molar Ratio | | |
| | Zirconium butoxide/MPTMS | 0.5 |

Reference is made to FIG. 1, which illustrates a flowchart of the process of preparing a functionalized organic-inorganic hybrid material in accordance with the embodiment. According to step 100, MPTMS of about 15 g (about 0.06 mole) is dissolved in a first solvent of about 30 g to form a first solution, which is then stirred about 30 to 60 minutes. A catalyst is further added to the first solution for aiding the hydrolysis of the MPTMS, in step 120. In the embodiment, the catalyst is 0.1N hydrochloride solution (HCl). In step 140, a second solution is formed by dissolving zirconium butoxide of about 11.5 g (about 0.03 mol) in a second solvent of about 10 g and stirring the second solution for around 10 to 30 minutes. The first solution and the second solution are next mixed and heated for a period of time in step 160. Generally, the temperature to which the solutions are heated is slightly lower than the boiling points of the solvents. Moreover, the first solvent may be the same as the second solvent, and hence the reaction is controlled more easily. In the embodiment of the present invention, the first solvent and the second solvent are both tetra-hydrofuran (THF), and the heating temperature is around 65° C.

Figure 2:
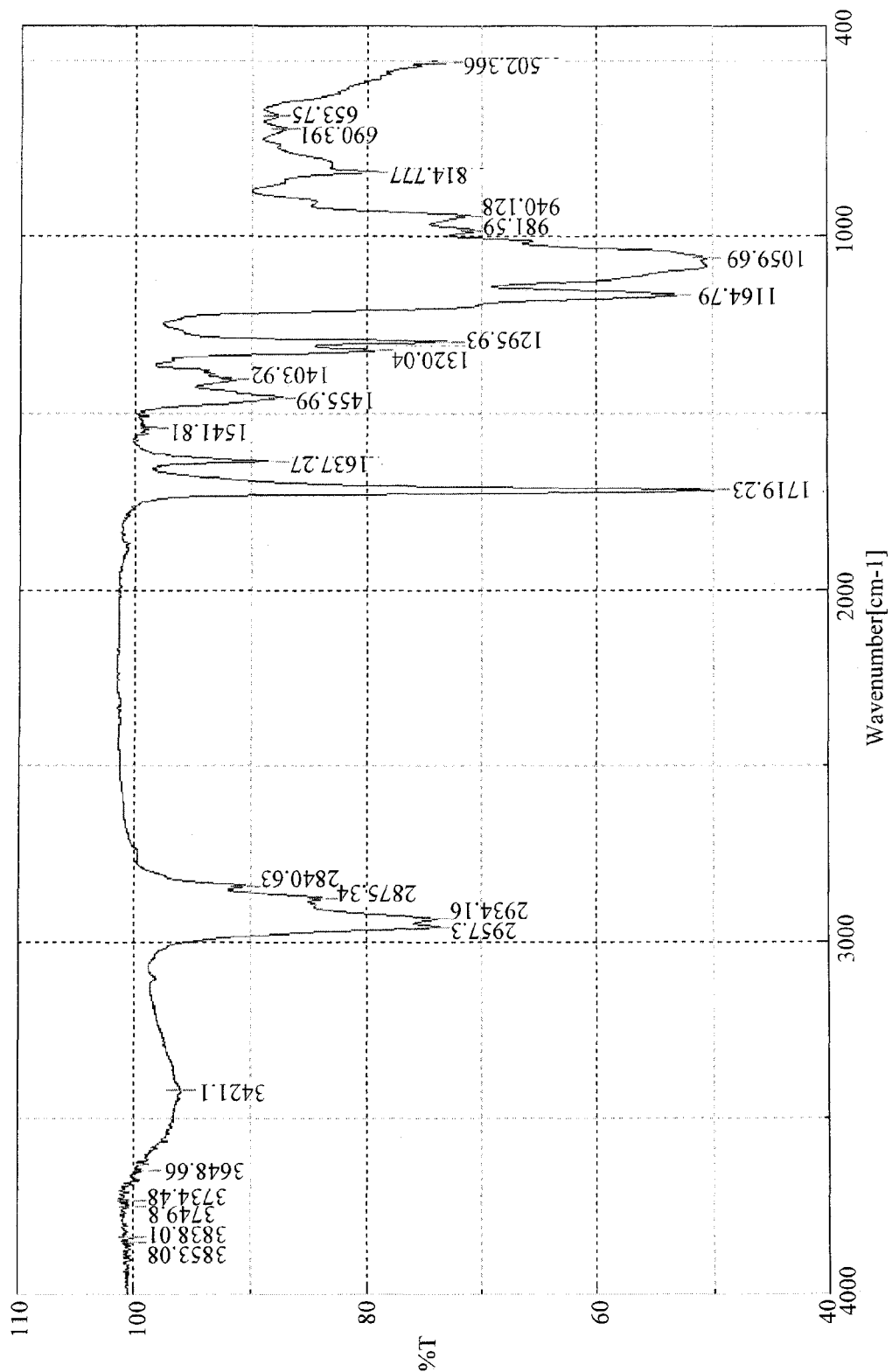
FIG. 2 illustrates an infrared spectrum of the functionalized organic-inorganic hybrid material prepared according to FIG. 1.

The resultant material is a transparent solution, which also implies that the resultant particles are on a nanometer (nm) scale and are well dispersed in the solvents. The Fourier Transformation infrared (FTIR) spectrum of the particles is shown in FIG. 2. The absorption band at around 1600 cm$^{-1}$ and around 1730 cm$^{-1}$ are due to the C═C stretching mode and the C═O stretching mode of MPTMS, respectively. The absorption band at about 840 cm$^{-1}$ is assigned to Zr—O—Si bonding. On this ground, a organic-inorganic hybrid material/particle having a photosensitive group is prepared.

Figure 3:
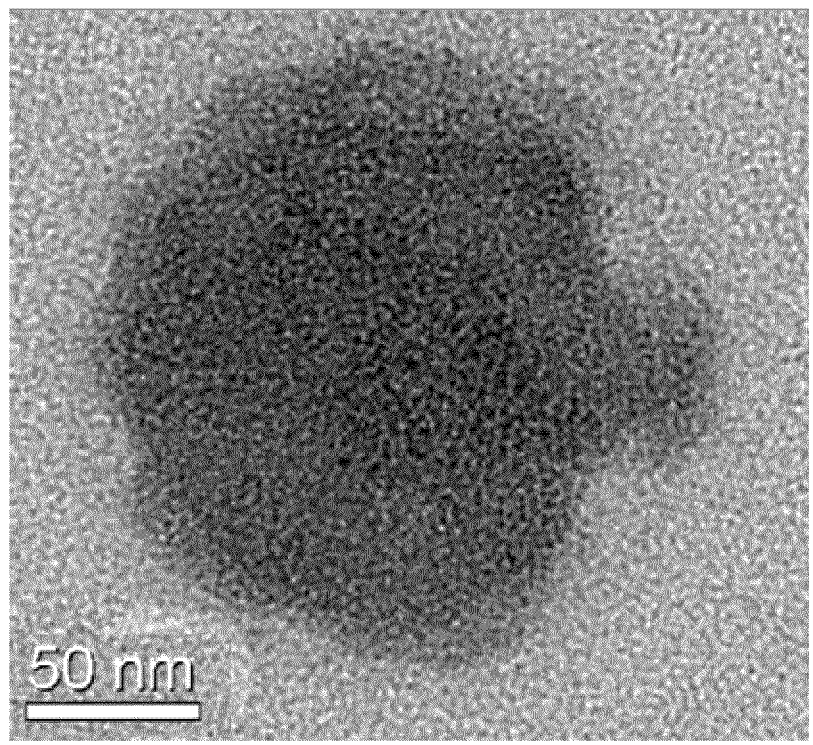
FIG. 3 shows a TEM picture of the functionalized organic-inorganic hybrid material prepared according to FIG. 1.

FIG. 3 is the transmission electron microscopy (TEM) picture of the particles, which further proves that the size of the resultant particles is smaller than 100 nm, and that the particle size distribution is uniform.

Further, the attraction energy ($A_{13}$) of THF as calculated by the aforementioned equation (2) is 11.1 or so. As a result, the interaction between the particles is decreased by THF, which prevents the particles from attracting one another and aggregating. Therefore, an organic-inorganic hybrid particle with stable dimensions is prepared through adequate solvents. Moreover, THF is only an exemplary solvent, and is not intended to limit the invention. Other solvents that provide stable reactive surroundings, for instance, toluene ($A_{13}$ is about 12.1) or propylene glycol monoether acetate (PMAc) ($A_{13}$ is about 9.6), are also used to prepare an organic-inorganic hybrid material with stable dimensions.

On the other hand, the aforenamed precursors and the proportions thereof are merely in favor of illustrating the embodiment. It is appreciated that any substitutes, although not described or shown herein, which embody the principles of the invention, are included within the spirit and scope of the invention. For instance, an organic-inorganic hybrid material having an epoxy group on a nanometer scale is formed through 3-glycidoxypropyl trimethoxysilane (GLYMO), in the case where solvents are appropriately selected at the beginning of preparation.

Embodiment 2

Comparative Example

In this embodiment, an organic-inorganic hybrid material is formed in alcohol under the same preliminary conditions as those in embodiment 1. The material in alcohol is further compared with materials formed in different solvents, which results are listed in Table 1.

TABLE 1

Comparative results of various materials formed in different solvents

| Solvent | Dielectric constant of solvent | Attraction energy ($A_{13}$) | Particle size (nm) | Solution condition |
|---|---|---|---|---|
| THF | 7.6 | 11.1 | <100 | Transparent |
| Toluene | 2.2 | 12.1 | <100 | Transparent |
| PMAc | 6.7 | 9.6 | <100 | Transparent |
| Alcohol | 25.7 | 1.1 | >5000 | Opaque |

It is found from Table 1 that, a transparent solution of organic-inorganic hybrid nanoparticles are obtained if an adequate solvent is selected. Consequently, nanoparticles attract one another and aggregate less, and thus have stable sizes, because solvents decrease the interaction between particles. On the contrary, larger particles are given in alcohol, and the resultant solution is opaque. Furthermore, the dielectric constant of solvents is preferably smaller than 10.

Embodiment 3

The organic-inorganic hybrid material can be further used for preparing a thick hybrid film or a thin hybrid film. In the following embodiment, preparation of a thick hybrid film is provided.

For preparing a thick hybrid film, the solid content of an organic-inorganic hybrid material is increased by transferring the same into another solvent in accordance with the present invention. The organic-inorganic hybrid material of Embodiment 1 herein is only an example to describe the process for convenience, which is not proposed to limit the invention.

Figure 4:
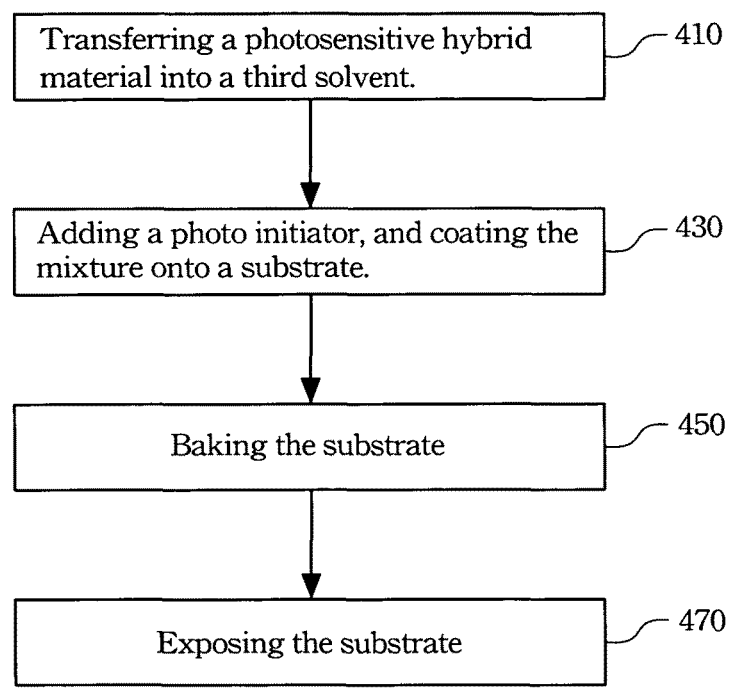
FIG. 4 illustrates a flowchart of preparing a thick hybrid film in accordance with another embodiment of the present invention.
Figure 5A:
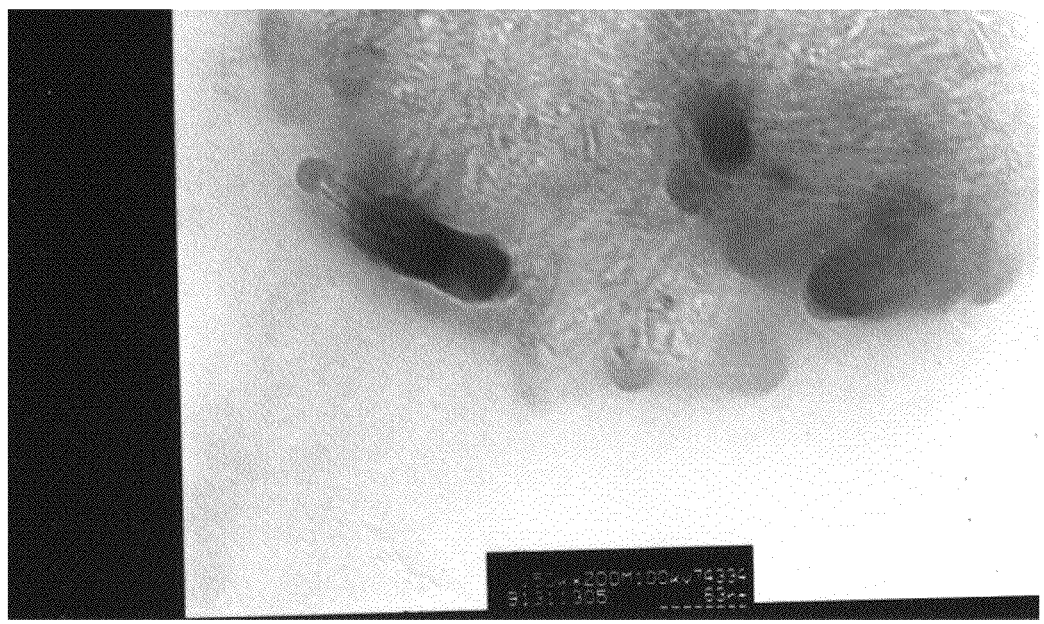
FIGS. 5A-5F show TEM pictures of the functionalized organic-inorganic hybrid materials prepared in accordance with another embodiment of the present invention.
Figure 5B:
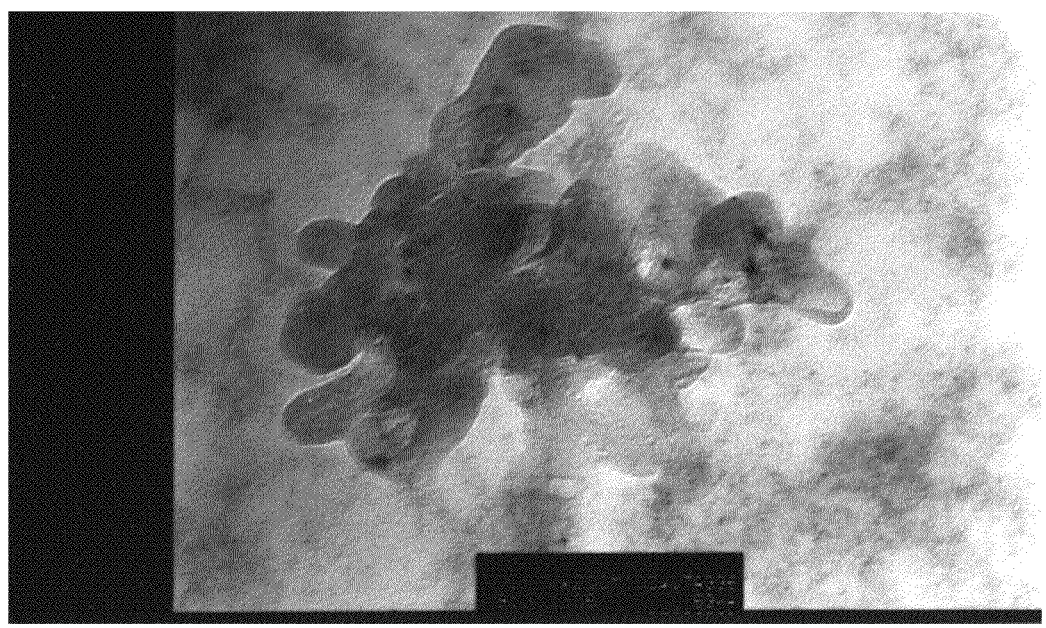
Figure 5C:
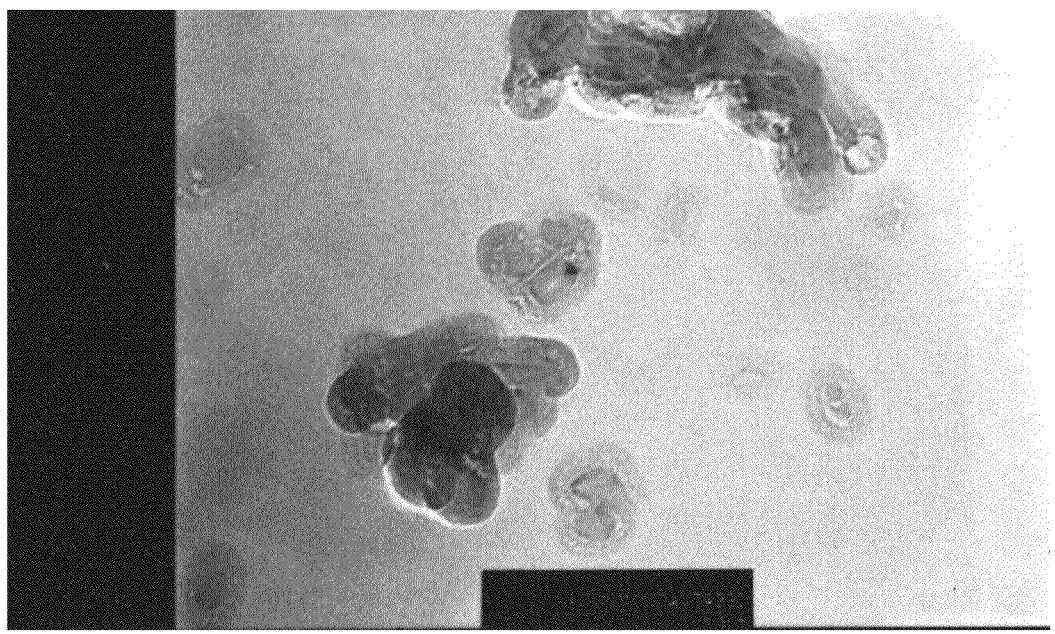
Figure 5D:
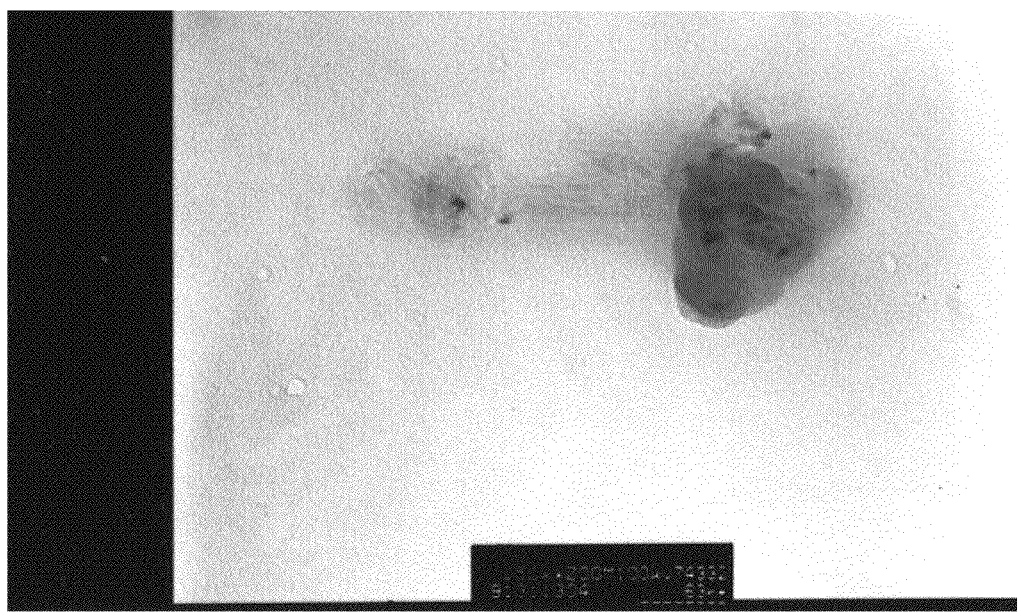
Figure 5E:
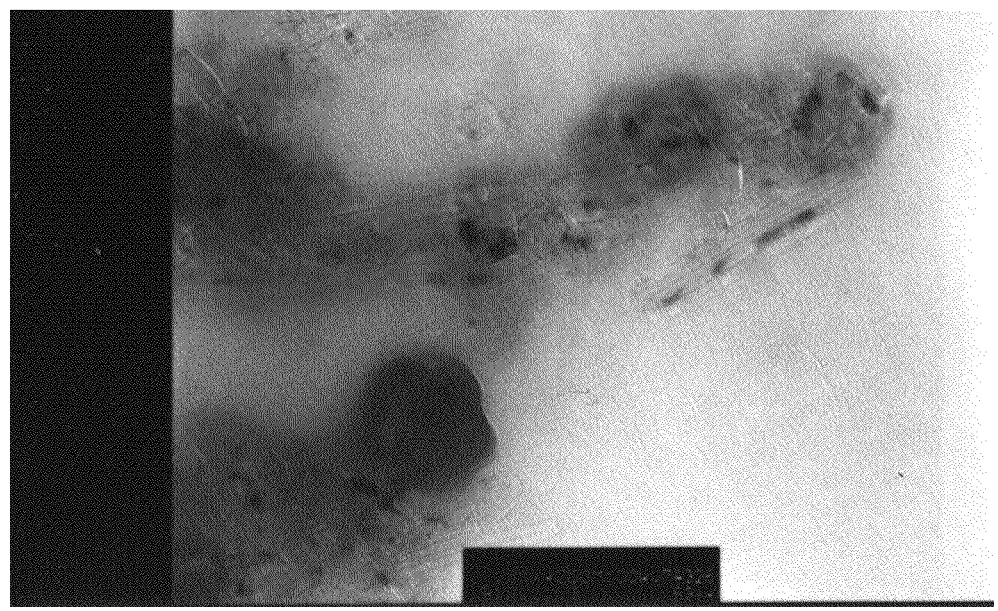
Figure 5F:
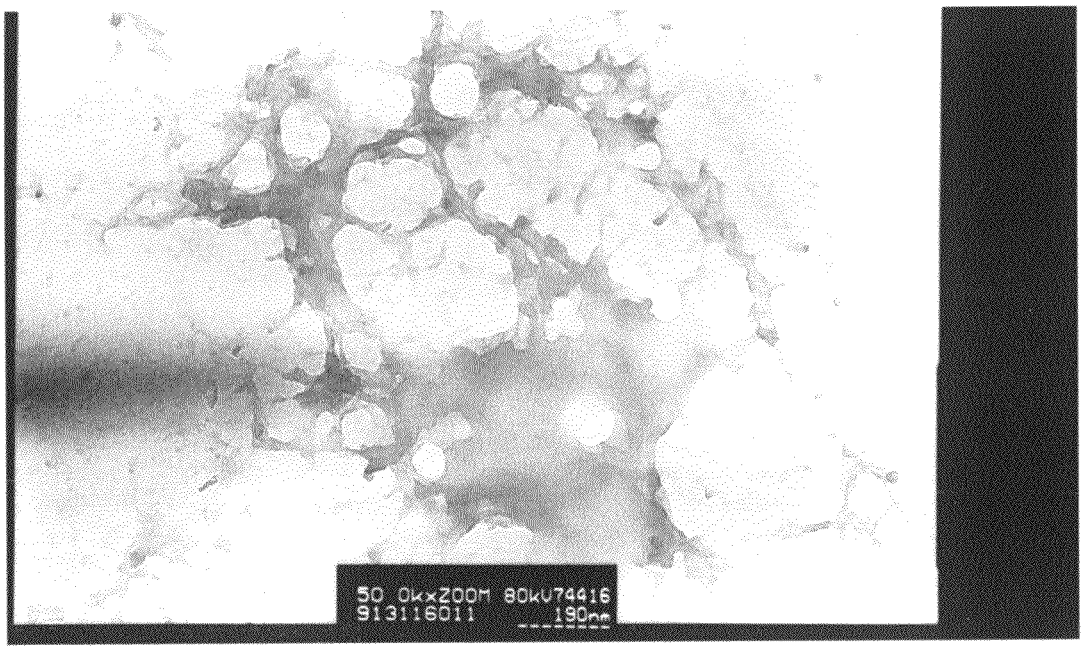

Reference is made to FIG. 4, which illustrates a flowchart of preparing a thick hybrid film according to the embodiment. The photosensitive organic-inorganic hybrid material of Embodiment 1 is first transferred into a third solvent, in step 410. The boiling point of the third solvent is greater than those of the first solvent and the second solvent. Additionally, the amount of the third solvent is less than the total amount of the first solvent and the second solvent. As a result, the first solvent and the second solvent are removed by heating, and the organic-inorganic hybrid material remains in the third solvent. Therefore, the solid content of the organic-inorganic hybrid material is increased. The third solvent is determined by its compatibility with an applied substrate, and is preferably propylene glycol monoether acetate in this embodiment. Then, in step 430, a photo initiator is mixed in the transferred third solvent, and the mixture is coated onto a substrate thereafter. The substrate is next baked in step 450. This baking step is only for preparing thick hybrid film, but for the preparation of a thin hybrid film, the baking step can be skipped. Furthermore, the baking temperature is dependent on the third solvent used. Since propylene glycol monoether was used as the third solvent herein, the baking temperature is around 150° C. Finally, the substrate is exposed in step 470. At this step, the photosensitive organic-inorganic hybrid material on the substrate is further cross-linked thoroughly, and a thick hybrid film is thus derived. The thickness of the hybrid film is up to 10 μm and above, when the solid content of the organic-inorganic hybrid material is raised to about 50%. In addition to that, the hybrid film prepared above can be optionally patterned during the exposure step, and then the area not exposed is removed to leave the pattern on the substrate.

In view of the above, a thick and uniform hybrid film is derived directly from a transferred organic-inorganic hybrid material in accordance with the embodiment. Consequently, no binder is required, and no phase separation occurs. Additionally, the thickness of a hybrid film can be controlled by adjusting the solid content of a organic-inorganic hybrid material. Further, the transmission of the hybrid film coated on a glass is above 90% in the visible range of 400 nm to 700 nm and at wavelengths of 1310 nm and 1550 nm. The baking temperature or species of the initiator and the third solvent are exemplary descriptions only, and are not proposed to limit the invention.

Embodiment 4

In the following embodiments of the present invention, other metal alkoxides or silicon alkoxide, instead of zirconium butoxide, were also provided to prepare the functionalized organic-inorganic hybrid material. The metal alkoxides or silicon alkoxide used were germanium (IV) ethoxide (Ge$(OC_2H_5)_4$), germanium (IV) isopropoxide (Ge$[OCH(CH_3)_2]_4$), titanium ethoxide (Ti$(OC_2H_5)_4$), tertabutyl orthotitanate (Ti$(OC_4H_9)_4$), tin (IV) tert-butoxide (Sn$(OC_4H_9)_4$), zirconium (IV) propoxide (Zr$(OC_3H_4)_4$), tetraethyl orthosilicate (Si$(OC_2H_5)_4$), zinc acetate dihydrate (Zn$(CH_3COO)_2$), or aluminum sec-butoxide (Al$[OC(CH_3)_2]_3$).

In general, all the procedures of preparing an organic-inorganic hybrid material were the same as described in embodiment 1. Again, MPTMS was used as the organically modified Si-alkoxide, and THF was used as the first and the second solvent. All of the reactants were listed in the following Table 2.

TABLE 2 the reactants used for preparing the functionalized organic-inorganic hybrid material

| Reactants | Sample | 1 | 2 | 3 | 4 | 5* |
|---|---|---|---|---|---|---|
| First Solution | MPTMS (g) | 9.578 | 7.98 | 13.4 | 13.4 | 6.12 |
| | MPTMS (mol) | 0.038 | 0.032 | 0.05 | 0.02 | 0.02 |
| | THF (g) | 5 | 3.6 | 6 | 6 | 3.02 |
| | 0.1 N HCl (g) | 0.669 | 0.557 | 0.936 | 0.936 | 0.433 |

TABLE 2-continued the reactants used for preparing the functionalized organic-inorganic hybrid material

| Second Solution | Metal alkoxides/silicon alkoxide | germanium (IV) ethoxide Ge(OC$_2$H$_5$)$_4$ | germanium (IV) isopropoxide Ge[OCH(CH$_3$)$_2$]$_4$ | titanium ethoxide Ti(OC$_2$H$_5$)$_4$ | titanium tertabutyl orthotitanate Ti(OC$_4$H$_9$)$_4$ | tin (IV) tert-butoxide Sn(OC$_4$H$_9$)$_4$ |
|---|---|---|---|---|---|---|
| | (g) | 4.88 | 9.42 | 6.11 | 9.12 | 5 |
| | (mol) | 0.019 | 0.03 | 0.026 | 0.03 | 0.01 |
| | THF (g) | 3.03 | 2.1 | 3.5 | 3.5 | 29.11 |
| Molar Ratio (Metal or silicon alkoxide/MPTMS) | | 0.5 | 0.94 | 0.52 | 1.5 | 0.5 |
| Solid Content in THF (%) | | 48.1 | 45 | 43.3 | 31.1 | 18.8 |
| Solid Content in PMAc (%) | | 68.2 | 67 | 61.3 | 57.1 | 39.2* |

| Reactants | Sample | 6 | 7 | 8** | 9 |
|---|---|---|---|---|---|
| First Solution | MPTMS (g) | 16.76 | 22.35 | 33.53 | 17.2 |
| | MPTMS (mol) | 0.067 | 0.089 | 0.135 | 0.069 |
| | THF (g) | 7.5 | 10 | 15 | 65.8 |
| | 0.1 N HCl (g) | 1.17 | 1.56 | 2.34 | 0.228 |
| Second Solution | Metal alkoxides/silicon alkoxide | zirconium (IV) propoxide Zr(OC$_3$H$_4$)$_4$ | tetraethyl orthosilicate Si(OC$_2$H$_5$)$_4$ | Zinc acetate dihydrateZn(CH$_3$COO)$_2$ | Aluminum t-butoxideAl[OC(CH$_3$)$_3$]$_3$ |
| | (g) | 11 | 9.3 | 14.694 | 8.73 |
| | (mol) | 0.028 | 0.044 | 0.066 | 0.036 |
| | THF (g) | 4.5 | 5.8 | 18.75 | 0 |
| Molar Ratio (Metal or silicon alkoxide/MPTMS) | | 0.42 | 0.49 | 0.49 | 0.52 |
| Solid Content in THF (%) | | 41.3 | 46.9 | 43 | 15 |
| Solid Contentin PMAc (%) | | 67.4 | 72.9 | 63 | 42 |

*In order to dissolve tin(IV)tert-butoxide in sample 5 completely, few more drops of 0.1 N HCl must be added into the second solution of sample 5.
**Zinc acetate dihydrate was treat with 36% HCl first In Table 2, the amounts of metal or silicon alkoxides is more than the amount used in prior arts, since the solvent is selected according to the results of Embodiment 2 above. The molar ratio of metal or silicon alkoxides to MTPMS (the organically modified Si-alkoxide) can be raised to at least 0.35 without any aggregation, although no chelating agent is added.

Figure 6:
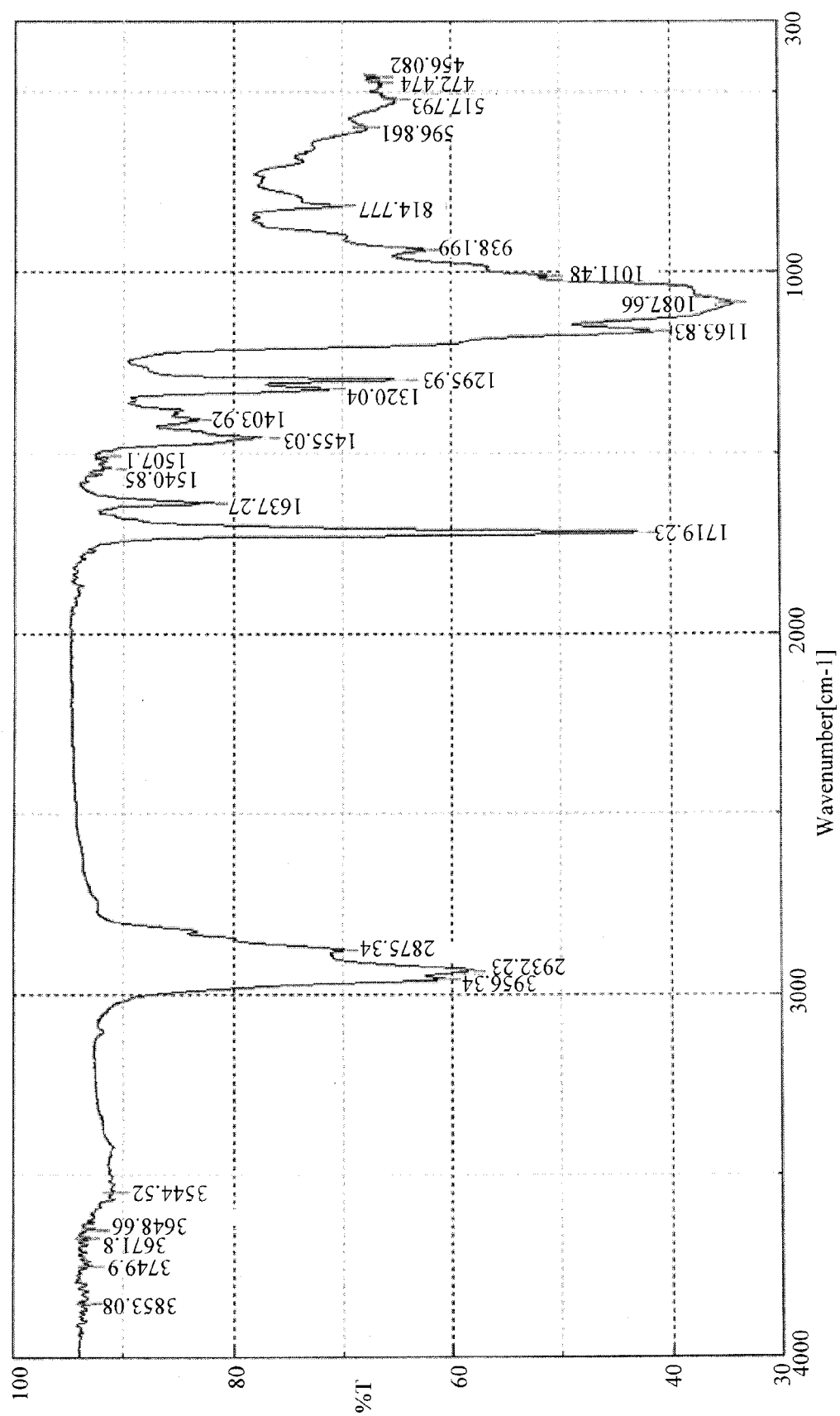
FIG. 6. illustrates an infrared spectrum of tertabutyl orthotitanate.

The particle scale of resultant organic-inorganic hybrid materials prepared above is also detected. The transmission electron microscopy (TEM) pictures of the particles in sample 2, 5, 6, 7, 9, and 4 are shown in FIGS. 5A-5F respectively. As indicated in FIGS. 5A-5F, the size of the resultant particles is below 200 nm, and even is as small as 63 nm. Furthermore, the structures of the resultant materials were also confirmed by the measurement of FTIR. The absorption band of Zn—O—Si is about 720 cm$^{-1}$, Al—O—Si is around 750 cm$^{-1}$, and Ti—O—Si is about 950 cm$^{-1}$. In FIG. 6 provided herein, it shows the FTIR spectrum of tertabutyl orthotitanate (sample 4), wherein the peak at 938 cm$^{-1}$ is attributed to the Ti—O—Si bonding.

Next, the photosensitive organic-inorganic hybrid material prepared above was transferred into a third solvent, propylene glycol monoether acetate (PMAc). Each sample's solid content was detected before and after transferring into PMAc. The results were also shown in Table 2. By comparing solid content of each sample in Table 2, it was noticed that the solid content of the organic-inorganic hybrid material was increased by transferring the organic-inorganic hybrid material form THF to PMAc. Taking sample 1 for example, the solid content was 48.1% in THF. After transferring sample 1 from THF to PMAc, the solid content was increased to 68.2%. Accordingly, the solid content of the organic-inorganic hybrid material can be raised at least 40% by transferring organic-inorganic hybrid material from THF to PMAc. Therefore, a thick and uniform film can be formed more easily, since the solid content of the organic-inorganic hybrid material has been increased.

Embodiment 5

In the embodiment of the present invention, by using the functionalized organic-inorganic hybrid material prepared in embodiment 4, the thick hybrid films were prepared and then the transmission of the hybrid films were detected. All the procedures of preparing the thick hybrid films were the same as described in embodiment 3. There are varieties of photo initiators can be used, such as CHEMCURE481, ITX907, Irgacure 184, Irgacure 907, etc. The amount of the photo initiators added is 1-5% of the solid content of MPTMS. In this embodiment, the photo initiator used was CHEMCURE481, and the amount of photo initiator added is 3% on the substrate. The transmission testing results were shown in Table 3 and FIG. 7.

TABLE 3

Transmission testing result

| Sample No. | 1 | 2 | 3 | 4 | 5 | 6 | 7 | 8 | 9 |
|---|---|---|---|---|---|---|---|---|---|
| Amount of Photo initiator (%) | 3% | 3% | 3% | 3% | 3% | 3% | 3% | 3% | 3% |
| Transmission (%) | over 90 | over 90 | over 90 | over 90 | over 90 | over 90 | over 90 | over 90 | over 90 |

Figure 7:
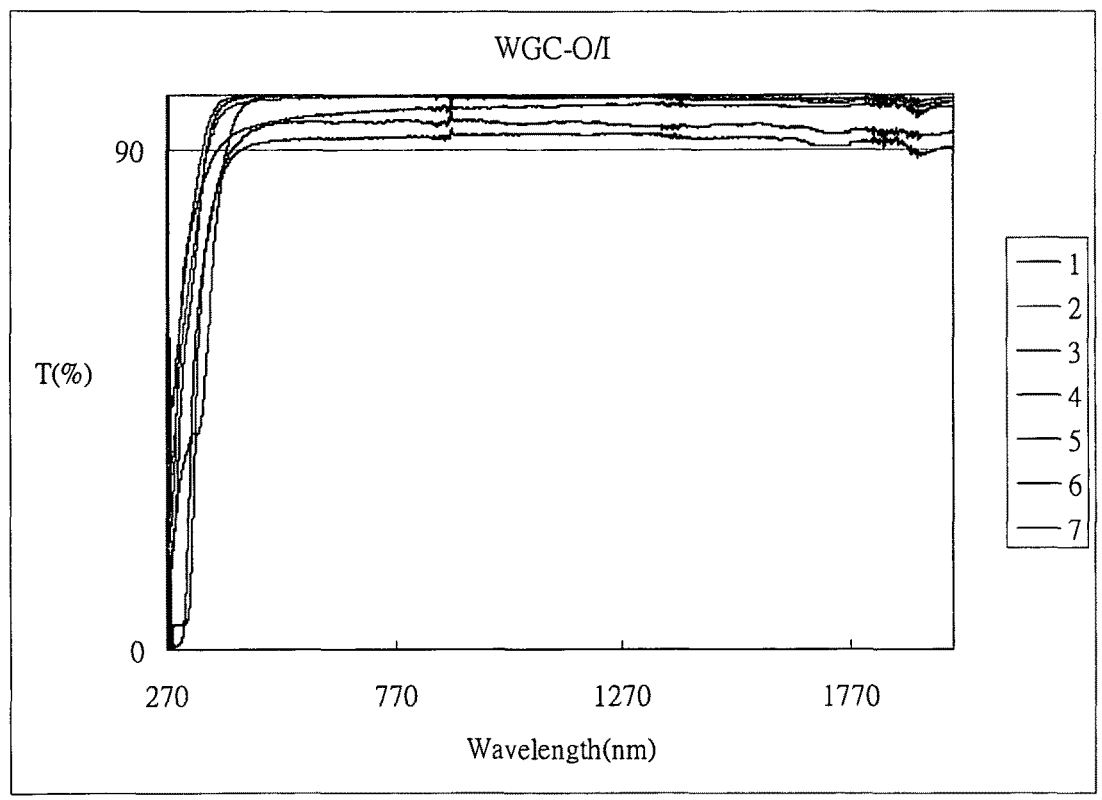
FIG. 7 illustrates a transmission testing result of thick hybrid films in accordance with another embodiment of the present invention.

According to the transmission results shown in Table 3 and FIG. 7, the transmission of the hybrid film coated on a glass is over 90% in the scanning range of 270 nm to 2000 nm.

Embodiment 6

The photo- or thermal-sensitivity of organic-inorganic hybrid materials is highly related to the predetermined functional group of the organically modified Si-alkoxide. Since MPTMS is with a photosensitive functional group, the organic-inorganic hybrid materials prepared by MPTMS above are photosensitive. In this embodiment of the present invention, three thermal-sensitive organic-inorganic hybrid materials were provided by using 3-glycidoxypropyl tri-methoxysilane (GPTS) comprising a thermal sensitive functional group. Basically, the process of preparing thermal-sensitive hybrid materials was the same as described in embodiment 1. All the reactants of the three samples were listed in the following Table 4. Instead of MPTMS, the organically modified Si-alkoxide used was GPTS. Furthermore, not only THF but also MeOH could be used as the first solvent and second solvent, and the acid added were either HCl or $HNO_3$.

TABLE 4 the reactants used for preparing the functionalized organic-inorganic hybrid material

| Reactants | Sample | 10 | 11 | 12 |
|---|---|---|---|---|
| First Solution | GPTS (g) | 3.5 | 3.5 | 46.5 |
| | GPTS (mol) | 0.015 | 0.015 | 0.20 |
| | Solvent | THF | MeOH | THF |
| | (g) | 30 | 15 | 40 |
| | Acid | $HNO_3$ | $HNO_3$ | HCl |
| | (g) | 8 | 8 | 8 |
| | $H_2O$ (g) | 0.22 | 0.22 | 0 |
| Second Solution | Metal alkoxides/ silicon alkoxide | tertabutyl orthotitanate $Ti(OC_4H_9)_4$ | tertabutyl orthotitanate $Ti(OC_4H_9)_4$ | tetraethyl orthosilicate $Si(OC_2H_5)_4$ |
| | (g) | 30 | 30 | 46.77 |
| | (mol) | 0.08 | 0.08 | 0.22 |
| | Solvent | THF | MeOH | THF |
| | (g) | 30 | 15 | 40 |
| Molar Ratio (Metal or silicon alkoxide/GPTS) | | 5.33 | 5.33 | 1.1 |
| Solid Content in THF (%) | | 15 | 27.5 | 25 |
| Concentrated in THF (%) | | 38 | 37 | 50 |

The thermal-sensitive organic-inorganic hybrid materials above can be used for preparing a hybrid film as well. First, the thermal-sensitive organic-inorganic hybrid material is mixed with epoxy merchandise, such as epoxy 4221, and then amine hardener is added. Next, as shown in FIG. 4, the mixture is coated onto a substrate. After that, the substrate is baked at below 150° C. so that a hybrid film can be derived.

According to the aforementioned embodiments of the present invention, a functionalized organic-inorganic hybrid material is prepared without any chelating agents in selected solvents. The resultant organic-inorganic hybrid particles are on a nanometer scale, and are stably dispersed in the selected solvents. On the other hand, a thick hybrid film is fabricated by means of the organic-inorganic hybrid material of which solid content is effectively increased by transferring the same into another solvent.

While the invention has been particularly shown and described with reference to the embodiments thereof, these are, of course, merely examples to help clarify the invention and are not intended to limit the invention. It will be understood by those skilled in the art that various changes, modifications, and alterations in form and details may be made therein without departing from the spirit and scope of the invention, as set forth in the following claims.

What is claimed is:

1. A method for preparing a dispersion solution of an organic-inorganic hybrid material, in sequence consisting essentially of the steps of:
   dissolving an organically modified Si-alkoxide and an acid aqueous solution in a first solvent having a dielectric constant smaller than 10 to form a first solution, and dissolving a metal alkoxide in a second solvent having a dielectric constant smaller than 10 to independently form a second solution free of a chelating agent, wherein the metal alkoxide is formulated as M(OR)x, M represents a metal atom, x is valence of M, and R is a $C_1$-$C_{12}$ alkyl group;
   mixing the first solution and the second solution to form a mixture solution; and
   heating the mixture solution to react the metal alkoxide with the organically modified Si-alkoxide to form organic-inorganic hybrid material, which stably disperse in the mixture solution without aggregation, and wherein the mixture solution has a solid content of about 15-48 wt %.

2. The method of claim 1, wherein the metal atom (M) is selected from a group consisting of titanium (Ti), zirconium (Zr), germanium (Ge), tin (Sn), and cerium (Ce).

3. The method of claim 2, wherein the metal alkoxide consists essentially of zirconium butoxide or zirconium propoxide.

4. The method of claim 1, wherein the organically modified Si-alkoxide consists essentially of the organically modified Si-alkoxide with an unsaturated functional group.

5. The method of claim 4, wherein the unsaturated functional group consists essentially of the organically modified Si-alkoxide with a vinyl group, an acryl group, or a photosensitive derivative thereof.

6. The method of claim 5, wherein the organically modified Si-alkoxide is methacryloxypropyl tri-methoxysilane.

7. The method of claim 1, wherein the organically modified Si-alkoxide consists essentially of the organically modified Si-alkoxide with an epoxy group or an amine group.

8. The method of claim 7, wherein the organically modified Si-alkoxide is 3-glycidoxypropyl tri-methoxysilane.

9. The method of claim 1, wherein the first solvent and the second solvent consists essentially of tetra-hydrofuran, toluene, or propylene glycol monoether acetate.

10. A method of preparing an organic-inorganic hybrid film, in sequence consisting essentially the steps of:
   dissolving an organically modified Si-alkoxide and an acid aqueous solution in a first solvent having a dielectric constant smaller than 10 to independently form a first solution, and
   dissolving a metal alkoxide in a second solvent having a dielectric constant smaller than 10 to form a second solution free of a chelating agent, wherein the metal alkoxide is formulated as M(OR)x, M represents a metal atom, x is valence of M, and R is a $C_1$-$C_{12}$ alkyl group;
   mixing the first solution and the second solution to form a mixture solution; and
   heating the mixture solution to react the metal alkoxide with the organically modified Si-alkoxide to form organic-inorganic hybrid material, which stably disperse in the mixture solution without aggregation, and wherein the mixture solution has a solid content of about 15-48 wt %;

transferring the heated mixture solution into a third solvent to form a third solution, wherein a boiling point of the third solvent is higher than boiling points of the first solution and the second solution, and the amount of the third solvent is less than the total amount of the first solvent and the second solvent;

removing the first and the second solvents of the third solution by heating to increase the solid content of the heated third solution to about 37-73 wt % without aggregation;

coating the heated third solution onto a substrate; and baking the substrate to obtain an organic-inorganic hybrid film.

11. The method of claim 10, wherein the hybrid film having a thickness of at least 10 μm.

12. The method of claim 10, wherein the third solvent has an initiator to promote the polymerization of the organic-inorganic hybrid nanoparticles.

13. The method of claim 10, wherein the organically modified Si-alkoxide consists essentially of the organically modified Si-alkoxide with a vinyl group, an acryl group, or a photosensitive derivative thereof.

14. The method of claim 13, wherein the organically modified Si-alkoxide is methacryloxypropyl tri-methoxysilane.

15. The method of claim 11, wherein the organically modified Si-alkoxide consists essentially of the organically modified Si-alkoxide with an epoxy group or an amine group.

16. The method of claim 15, wherein the organically modified Si-alkoxide is 3-glycidoxypropyl tri-methoxysilane.

17. The method of claim 11, wherein the metal atom (M) is selected from a group consisting of titanium (Ti), zirconium (Zr), germanium (Ge), tin (Sn), and cerium (Ce).

18. The method of claim 17, wherein the metal alkoxide consists essentially of zirconium butoxide or zirconium propoxide.

19. The method of claim 10, wherein the first solvent and the second solvent consists essentially of tetra-hydrofuran or toluene.

20. The method of claim 19, wherein the third solvent consists essentially of propylene glycol monoether acetate.

21. A method for preparing a dispersion solution of an organic-inorganic hybrid material, in sequence consisting essentially of the steps of:

dissolving an organically modified Si-alkoxide and an acid aqueous solution in a first solvent having a dielectric constant smaller than 10 to form a first solution, and dissolving a metal alkoxide in a second solvent having a dielectric constant smaller than 10 to independently form a second solution free of a chelating agent, wherein the metal alkoxide is formulated as M(OR)x, M represents a metal atom, x is valence of M, and R is a $C_1$-$C_{12}$ alkyl group;

mixing the first solution and the second solution to form a mixture solution;

heating the mixture solution to react the metal alkoxide with the organically modified Si-alkoxide to form organic-inorganic hybrid material, which stably disperse in the mixture solution without aggregation, and wherein the mixture solution has a solid content of about 15-48 wt %;

transferring the heated mixture solution into a third solvent to form a third solution, wherein a boiling point of the third solvent is higher than boiling points of the first solution and the second solution, and the amount of the third solvent is less than the total amount of the first solvent and the second solvent; and removing the first and the second solvents of the third solution by heating to increase the solid content of the heated third solution to about 37-73 wt % without aggregation.

* * * * *